(12) United States Patent
Menezes

(10) Patent No.: US 10,068,638 B2
(45) Date of Patent: Sep. 4, 2018

(54) APPARATUS WITH LOW POWER SRAM RETENTION MODE

(71) Applicant: Texas Instruments Incorporated, Dallas, TX (US)

(72) Inventor: Vinod Menezes, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/393,552

(22) Filed: Dec. 29, 2016

(65) Prior Publication Data
US 2018/0190343 A1 Jul. 5, 2018

(51) Int. Cl.
*G11C 11/417* (2006.01)
*G11C 11/412* (2006.01)

(52) U.S. Cl.
CPC .......... *G11C 11/417* (2013.01); *G11C 11/412* (2013.01)

(58) Field of Classification Search
None
See application file for complete search history.

(56) References Cited

U.S. PATENT DOCUMENTS

2007/0121358 A1* 5/2007 Hirota .................... G11C 5/148
365/1

* cited by examiner

*Primary Examiner* — James G Norman
(74) *Attorney, Agent, or Firm* — Michael A. Davis, Jr.; Charles A. Brill; Frank D. Cimino

(57) ABSTRACT

A memory array and an integrated circuit are disclosed. The memory array includes first and second banks of memory elements and five switches. Each memory element of the first bank of memory elements is coupled to an upper rail and to a first node, while each memory element of the second bank of memory elements is coupled to a second node and to a lower rail. The first switch is coupled between the first node and the second node; the second switch is coupled between the first node and the lower rail; and the third switch is coupled between the second node and the upper rail. A fourth switch is coupled between the first node and a voltage that is one diode drop above the lower rail, and a fifth switch is coupled between the second node and a voltage that is one diode drop below the upper rail.

13 Claims, 6 Drawing Sheets

APPARATUS WITH LOW POWER SRAM RETENTION MODE

FIELD OF THE DISCLOSURE

Disclosed embodiments relate generally to the field of computer memory. More particularly, and not by way of any limitation, the present disclosure is directed to an apparatus with a low power SRAM retention mode.

BACKGROUND

Static Random Access Memory (SRAM) is used on most System on Chip (SoC) devices. Many hand-held devices, including Internet of Things (IoT) devices, require very low power consumption and long battery life, yet often these devices are required to hold the contents of the SRAM for extended periods of time. When the power to the SRAM is turned off, data stored in the bitcells is lost. However, when the bitcells are idle, i.e., not being read or written, the bitcells can be placed in retention mode, which utilizes much less power. This is possible because the voltage headroom for the SRAM can be reduced during retention mode, as the static noise margin is better when the wordline is OFF than during accesses to the bitcell when the wordline is ON. The reduced headroom leads to a lower leakage current through the bitcells. However, these systems can be heavily duty cycled and are typically energy starved, so even with the reduction in voltage headroom, SRAM leakage during retention mode is a significant proportion of the power budget of any SoC. Accordingly, the usage of power in retention mode is of critical importance.

SUMMARY

Disclosed embodiments provide stacking of bitcells such that a first bank of bitcells can be coupled to a second bank of bitcells during retention mode, allowing the leakage current from the first bank of bitcells to be passed to the second bank of bitcells. A switching circuit that sits between the first and second banks of bitcells switches between three modes: functional mode when the first and second banks of bitcells are separately coupled to the upper and lower rails, retention mode when the first and second bank of bitcells are coupled together, and a momentary transition mode where the first bank of bitcells is coupled to the lower rail through a diode and the second bank of bitcells is coupled to the upper rail through a diode.

In one aspect, an embodiment of a memory array is disclosed. The memory array includes a first plurality of memory elements, each memory element of the first plurality of memory elements being coupled to an upper rail and to a first node; a second plurality of memory elements, each memory element of the second plurality of memory elements being coupled to a second node and to a lower rail; a first switch coupled between the first node and the second node; a second switch coupled between the first node and the lower rail; a third switch coupled between the second node and the upper rail; a fourth switch coupled between the first node and a voltage that is one diode drop above the lower rail; and a fifth switch coupled between the second node and a voltage that is one diode drop below the upper rail.

In another aspect, an embodiment of an integrated circuit is disclosed. The integrated circuit includes a first plurality of Static Random Access Memory (SRAM) bitcells, each bitcell of the first plurality of SRAM bitcells being coupled to an upper rail, to a first node, and to a first bitline pair; a second plurality of SRAM bitcells, each bitcell of the second plurality of SRAM bitcells being coupled to a second node, to the lower rail, and to a second bitline pair; and a switching circuit coupled to the first node and to the second node, the switching circuit operating, when the first and second plurality of SRAM bitcells are in retention mode, to couple the first node to the second node.

BRIEF DESCRIPTION OF THE DRAWINGS

Embodiments of the present disclosure are illustrated by way of example, and not by way of limitation, in the figures of the accompanying drawings in which like references indicate similar elements. It should be noted that different references to "an" or "one" embodiment in this disclosure are not necessarily to the same embodiment, and such references may mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary embodiments of the present disclosure. Various advantages and features of the disclosure will be understood from the following Detailed Description taken in connection with the appended claims and with reference to the attached drawing figures in which:

DETAILED DESCRIPTION OF THE DRAWINGS

Specific embodiments of the invention will now be described in detail with reference to the accompanying figures. In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description.

Figure 5:
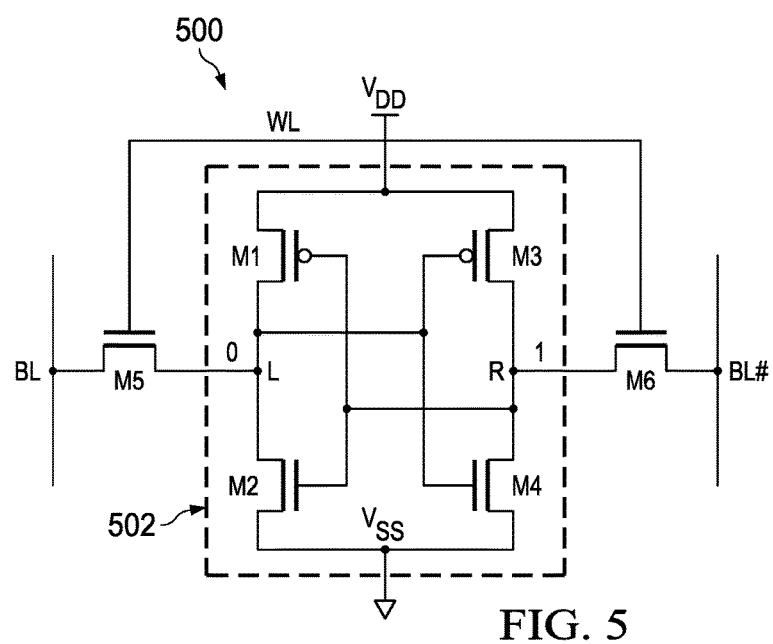
FIG. 5 depicts a bitcell as the bitcell is coupled during functional mode according to the prior art.

FIG. 5 depicts an SRAM bitcell 500 according to the prior art, showing the connections when bitcell 500 is in functional mode and can be read or written to. In the embodiment shown, bitcell 500 includes a latch 502, which is formed using two cross-coupled inverters, and two access transistors M5, M6, which control access to latch 502 during read and write operations. A first inverter includes p-type transistor M1 and n-type transistor M2, which have their respective drains coupled together, while the source of transistor M1 is coupled to the upper rail and the source of transistor M2 is coupled to the lower rail. Similarly, the second inverter includes p-type transistor M3 and n-type transistor M4, which have their respective drains coupled together, while the source of transistor M3 is coupled to the upper rail and the source of transistor M4 is coupled to the lower rail. The gates of transistors M1, M2 are coupled to a point between the drains of transistors M3 and M4, while the gates of transistors M3, M4 are coupled to a point between the drains of transistors M1 and M2. Access transistor M5 has source/drain terminals coupled respectively to bitline BL and the drains of transistors M1, M2; access transistor M6 has source/drain terminals coupled respectively to bitline BL# and the drains of transistors M3, M4. Both of transistors M5, M6 are controlled by wordline WL. In one embodiment, transistors M1, M3 are p-type metal oxide silicon (PMOS) transistors and transistors M2, M4, M5, M6 are n-type metal oxide silicon (NMOS) transistors.

Figure 6:
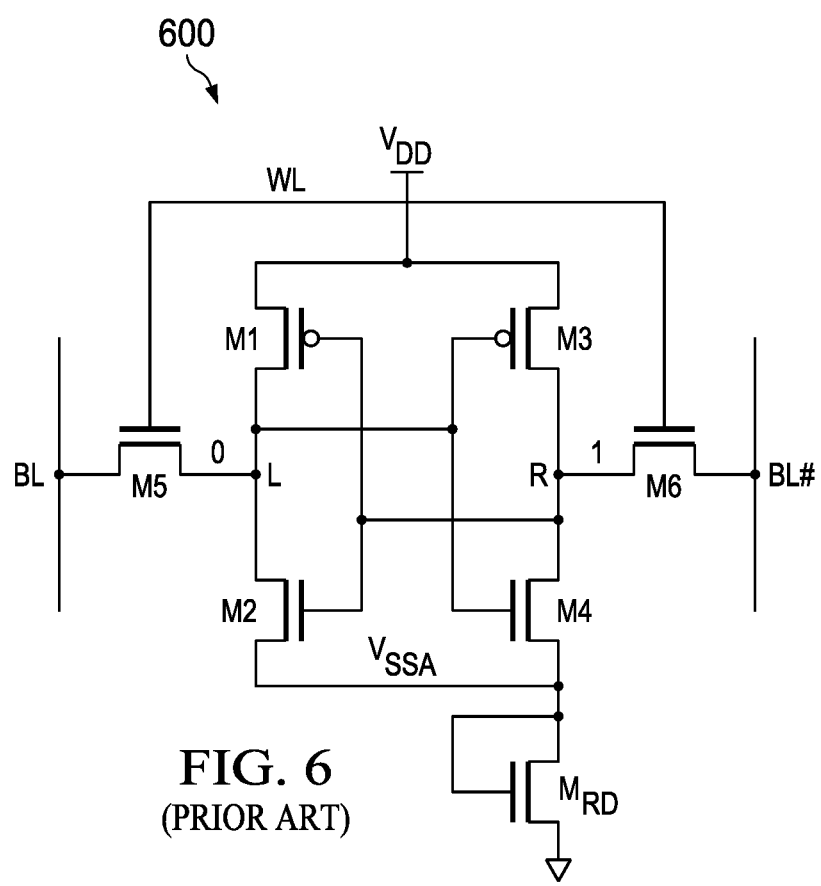
FIG. 6 depicts a bitcell as the bitcell is coupled during retention mode according to the prior art.

FIG. 6 depicts bitcell 600 as the same bitcell is coupled during retention mode. During retention mode, the headroom of bitcell 600 is reduced in order to reduce the leakage current through the bitcell. This reduction in headroom can be accomplished by either lowering the voltage on $V_{DD}$ or raising the voltage on $V_{SS}$. Rather than providing a separate supply voltage for use during retention mode, a diode is generally inserted between the bitcell and one of the rails of the bitcell array. As shown in FIG. 6, the diode is implemented as a diode-coupled transistor $M_{RD}$, which is coupled between the sources of transistors M2, M4 and the lower rail. In a second embodiment, not specifically shown, diode-coupled transistor $M_{RD}$ is instead coupled between the upper rail and the sources of transistors M1, M3. Transistor $M_{RD}$ is generally designed so that about half of the voltage of the circuit falls across the bitcell and the remaining half of the voltage falls across the transistor $M_{RD}$. It is theoretically possible to reduce the voltage even further, as most bitcells can retain information with as little as a quarter of the normal voltage. However, due to variations in processing across the array, there are typically outliers in the bitcells that need a greater voltage to retain information. For this reason, it is common to reduce voltage by about half, which reduces the leakage current proportionally.

With the current reduced by half, the power budget for the SRAM is also cut in half. Currently, the diode used to provide the reduced voltage for retention mode is stacked with the bitcell, i.e., the bitcell physically overlies the diode. Proposals have been made to stack various complete modules to save power, such as a processor/processor stack, a memory/processor stack, and a memory/memory stack. Most of the proposed techniques require level-shifter overhead and many of the techniques are complex with respect to handling stacking.

Figure 1A:
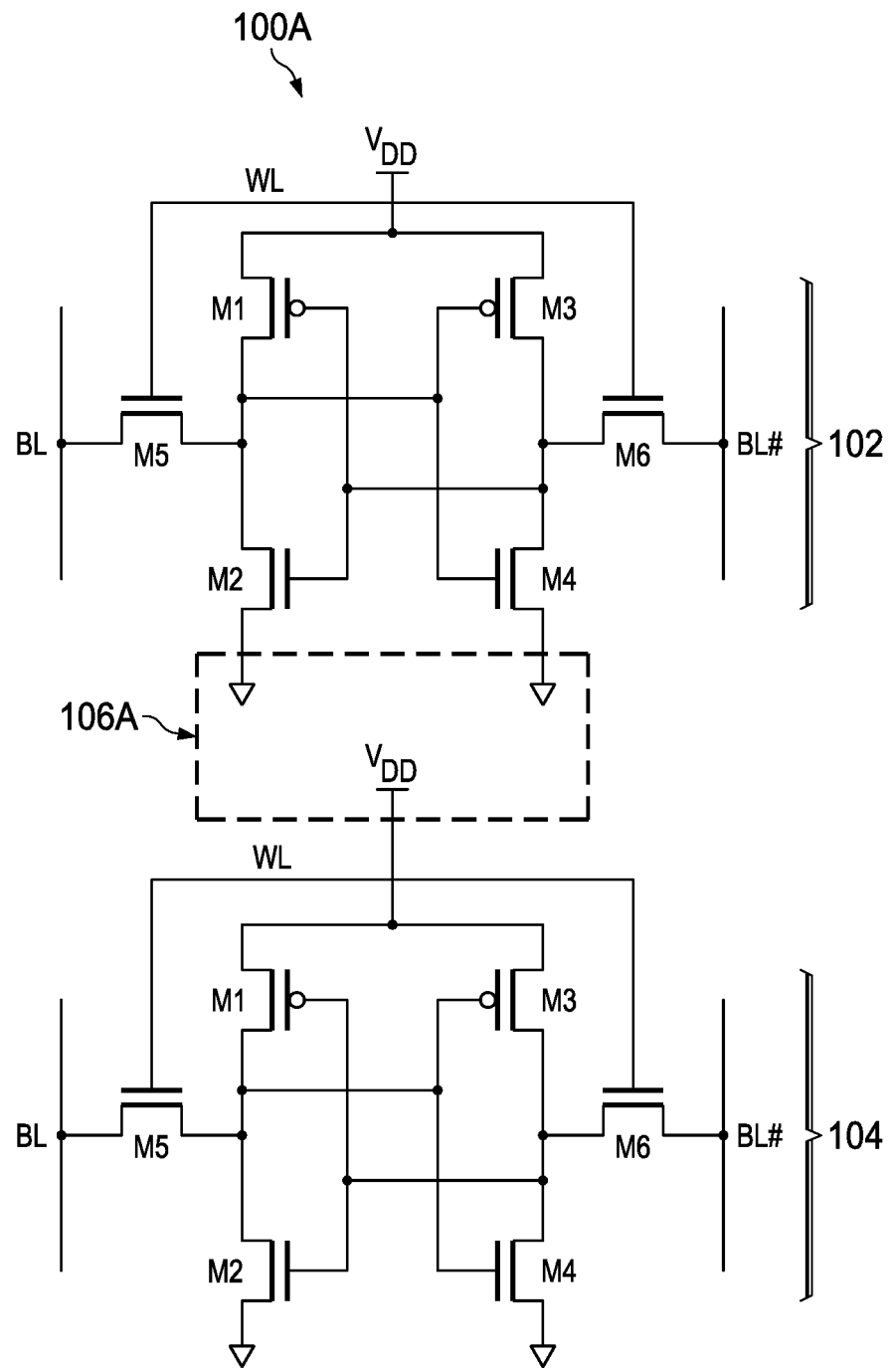
FIG. 1A depicts a circuit diagram of a pair of stacked bitcells during functional mode according to an embodiment of the disclosure.
Figure 1B:
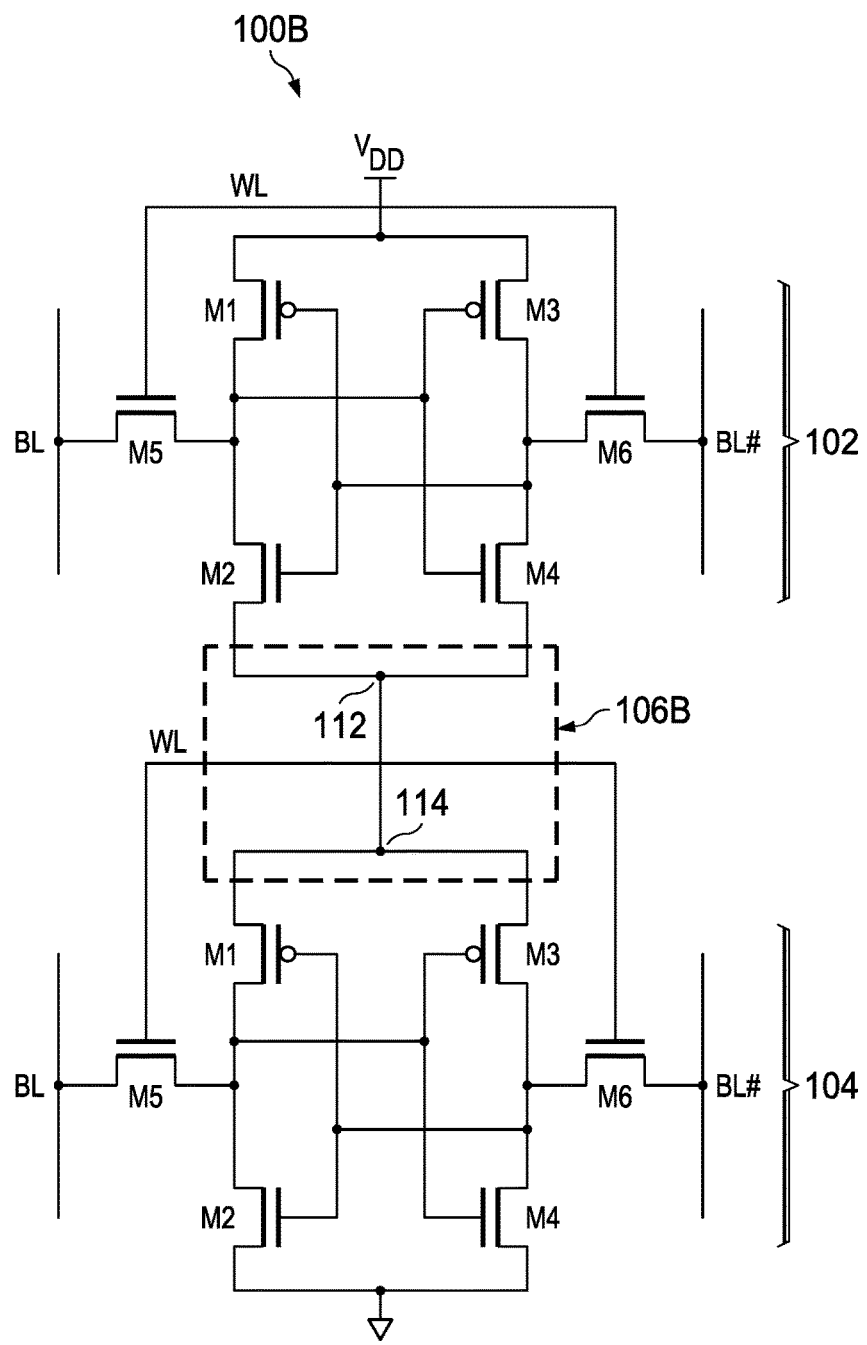
FIG. 1B depicts a circuit diagram of the pair of stacked bitcells during retention mode according to an embodiment of the disclosure.

Referring now to FIGS. 1A and 1B, these figures depict circuit diagrams of a pair of bitcells, showing the connections that exist in both functional mode and retention mode. In FIGS. 1A and 1B, bitcell 102 is stacked above bitcell 104. A switching circuit separates bitcells 102, 104 and operates to selectively connect the two bitcells, with switching circuit 106A depicting the connections during functional mode and switching circuit 106B depicting the connections during retention mode. Circuit diagram 100A depicts the two bitcells 102, 104 during functional mode, when bitcell 102 and bitcell 104 are able to be read and written. In functional mode, switching circuit 106A provides no connection between bitcell 102 and bitcell 104, i.e., transistors M2 and M4 of bitcell 102 are coupled to the lower rail and transistors M1 and M3 of bitcell 104 are coupled to the upper rail; both bitcells operate normally. Circuit diagram 100B depicts the two bitcells 102, 104 during retention mode, when voltage can be reduced to save power. In retention mode, switching circuit 106B couples a first node 112 in bitcell 102, which is coupled to the sources of transistors M2 and M4, to a second node 114 in bitcell 104, which is coupled to the sources of transistors M1 and M3. When this coupling occurs, the normal voltage drop across a single bitcell will now be shared across both bitcells 102, 104. Coupling the two bitcells 102, 104 together allows the leakage current from bitcell 102 to be utilized by bitcell 104. The fifty percent power that was previously lost in a diode coupled to bitcell 102 is now used for retention in bitcell 104. No level shifters are required to ensure a proper voltage for both bitcells. More details of circuitry utilizing bitcells 102, 104 and switching circuitry 106 are provided below.

Figure 2:
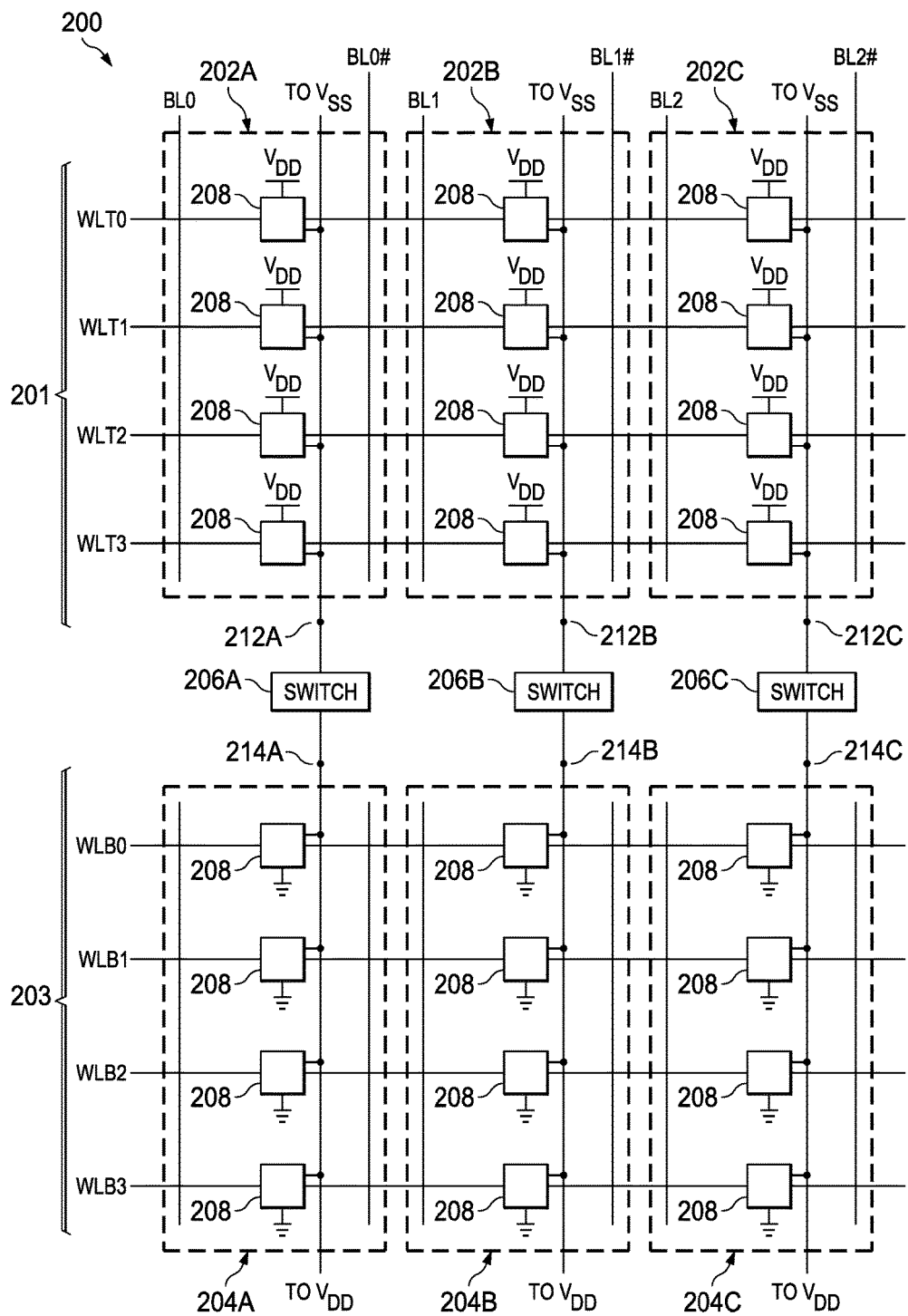
FIG. 2 depicts two banks of bitcells that are coupled via switching circuits during retention mode according to an embodiment of the disclosure.

Although the embodiment shown in FIGS. 1A and 1B provides the desired saving in power usage during retention mode, providing a switching circuit for each pair of bitcells utilizes a large amount of real estate on a memory chip when implemented in silicon. FIG. 2 depicts a circuit diagram of a portion of memory array 200, in which banks of bitcells are coupled via switching circuits during retention mode according to an embodiment of the disclosure. In memory array 200, each bitcell 208 is shown as a black box having five connections: a wordline WL, two bitlines BL and BL#, and two power connections that lead directly or indirectly to $V_{DD}$ and $V_{SS}$. The upper section 201 of memory array 200 depicts a total of twelve bitcells 208 arranged in four rows and three columns and a the lower section 203 of memory array 200 shows another twelve bitcells 208 arranged in four rows and three columns. In one embodiment, which is shown as memory array 200, three banks 202A, 202B, 202C of bitcells 208 are shown in section 201 and three banks 204A, 204B, 204C of bitcells 208 are shown in section 203. It will be understood that only a fraction of the hundreds or thousands of bitcells in the memory array 200 are illustrated herein and that a single wordline or bitline can be coupled to a hundred or more bitcells. In the embodiment shown, bitcells 208 can be a six-transistor bitcell as is shown in FIGS. 1A and 1B, but can also be any other configuration of SRAM bitcell, e.g., 4, 8, or 10 transistor bitcells.

In section 201, each row of bitcells 208 is coupled to one of wordlines WLT0, WLT1, WLT2, WLT3 and each bank 202A, 202B, 202C, 204A, 204B, 204C of bitcells 208 is coupled to one pair of bitlines (BL0, BL0#), (BL1, BL1#), (BL2, BL2#). Each bitcell 208 in section 201 is coupled to the upper rail, $V_{DD}$, and each bank 202A, 202B, 202C of bitcells 208 in section 201 is coupled to a respective common node 212A, 212B, 212C, which is used to couple the respective bank 212A, 212B, 212C of bitcells 208 either directly or indirectly to the lower rail, $V_{SS}$. Common node 212A, 212B, 212C for each bank 202A, 202B, 202C is coupled to a respective switch 206A, 206B, 206C. Similarly in section 203, each row of bitcells 208 is coupled to one of wordlines WLB0, WLB1, WLB2, WLB3 and each bank 204A, 204B, 204C of bitcells 208 is coupled to one of the same pair of bitlines as the corresponding bank in section 201. Each bitcell 208 in section 203 is coupled to the lower rail, i.e., $V_{SS}$ and each bitcell 208 in a bank 204A, 204B, 204C is coupled to a respective common node 214A, 214B, 214C, which is used to couple this bank 204A, 204B, 204C of bitcells 208 directly or indirectly to the upper rail $V_{DD}$. Common node 214A, 214B, 214C for each bank 204A, 204B, 204C is coupled to a respective switching circuit 206A, 206B, 206C. In one embodiment the first section of bitcells 201 is physically provided in a position that overlies the second section of bitcells 203; and the set of switches 206A, 206B, 206C is positioned between the sections of bitcells 201, 203, i.e., section 201 is stacked on top of switches 206A, 206B, 206C, which are stacked on top of section 203.

Using the embodiment shown in FIG. 2 not only saves the area needed for a large number of switches, but also allows averaging of the leakage from a number of cells in a bank 202A, 202B, 202C, as well as averaging the needs of a number of cells in a bank 204A, 202B, 202C. In general, a bank 202A and a bank 204A that are coupled through switching circuit 206A will have an equal number of bits in each. Multiple bits in parallel in the banks 202A, 204A helps to average out variations in leakage from bit to bit due to process variation. This, in turn, causes the two stacks to split the total supply voltage more equitably. In one embodiment, not specifically shown, a single shared common switch is utilized. Section 201 becomes a single bank, with each bitcell in bank 201 being coupled to a single common node that is also coupled to a single switching circuit for coupling to the lower rail. Likewise, section 203 then becomes a single bank, with each bitcell in bank 203 being coupled to a single common node that is also coupled to the single switching circuit for coupling to the upper rail.

Figure 3A:
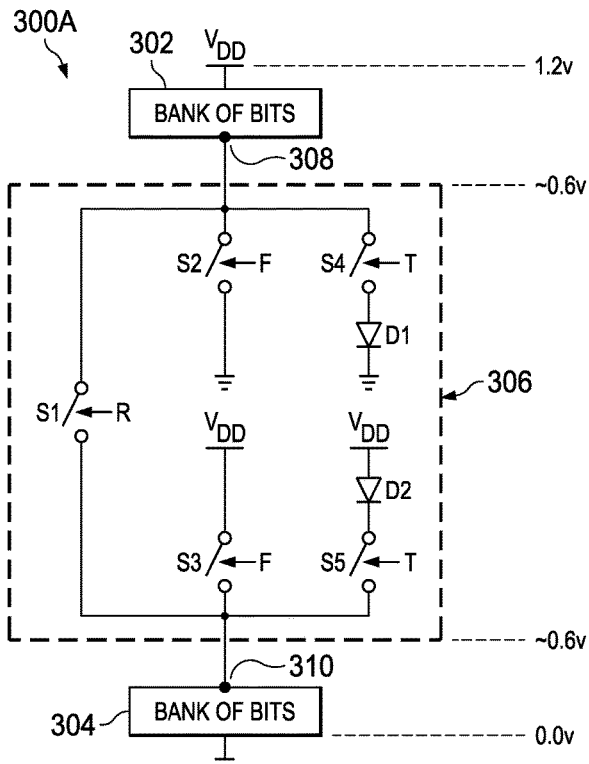
FIG. 3A depicts a schematic diagram of a switching circuit used to selectively couple two banks of bitcells according to an embodiment of the disclosure.

FIG. 3A depicts a schematic circuit diagram 300A of two banks of bits 302, 304 that share switching circuit 306, which can be any of the switches 206A, 206B, 206C of FIG. 2. In one embodiment, the first bank of bits 302 and the second bank of bits 304 share a common pair of bitlines BL and BL#. The bank of bits 302 is coupled to upper power rail $V_{DD}$ and the bank of bits 304 is coupled to the lower rail, also known as $V_{SS}$. Node 308 of bank of bits 302 and node 310 of bank of bits 304 are each coupled to switching circuit 306, so that the banks of bits can be selectively coupled during retention mode. While it is possible to switch the two banks of bits directly from a functional mode to a retention mode where bank of bits 302, 304 are coupled, doing so can cause corruption within the array of bitcells. In order to provide for a graceful transition, switching circuit 306 is configured to switch from the functional mode to the retention mode or from the retention mode to the functional mode only after momentarily moving to a transitional mode, in which a diode is used to decrease the current flow through each of the banks of bitcells 302, 304. Switching circuit 306 typically switches to transition mode for a very short time while the circuits are allowed to settle, then switches to the desired mode.

To accommodate the need for a transition mode, switching circuit 306 contains five switches: S1-S5. Switch S1, when closed, provides a direct coupling between bank of bits 302 and bank of bits 304, so that leakage current from bank of bits 302 can be used to power bank of bits 304; S1 is closed only when signal R is ON to indicate retention mode. Switches S2 and S3 are closed by signal F, which indicates the functional mode, when the banks of bits 302, 304 can be written or read. When closed, switch S2 couples node 308 of bank of bits 302 to the lower rail and switch S4 couples bank of bits 304 to the upper rail. Switches S4 and S5 are controlled by signal T and are utilized only during the momentary transition mode. When closed, switch S4 couples bank of bits 302 to the lower rail through diode D1, so that node 308 is coupled to a voltage that is one diode drop above the lower rail and switch S5 couples bank of bits 304 to the upper rail through diode D2 so that node 310 is coupled to a voltage that is one diode drop below the upper rail. As seen by the voltages shown on the right-hand side of FIG. 3A, when switch S1 is closed, the voltage drop across the circuit is split roughly equally between the two banks of bits 302, 304. If $V_{DD}$ is 1.2 volts and $V_{SS}$ is 0.0 volts, a voltage drop of approximately 0.6 volts occurs across bank of bits 302 and a second voltage drop of approximately 0.6 volts occurs across bank of bits 304.

Figure 3B:
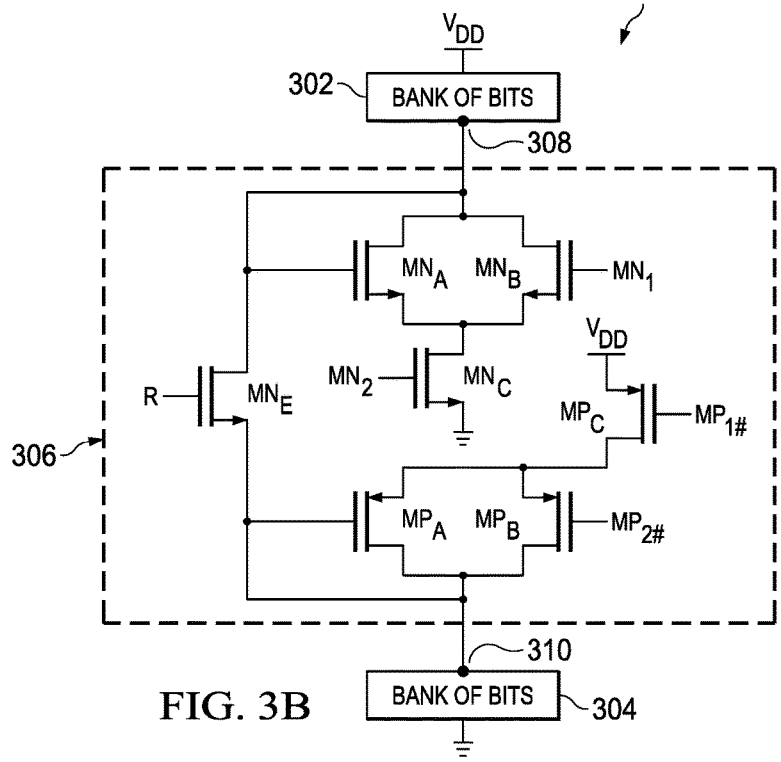
FIG. 3B depicts an implementation of a switching circuit used to selectively couple two banks of bitcells according to an embodiment of the disclosure.

FIG. 3B depicts a specific implementation of switching circuit 300B, although it will be recognized that many implementations of the switching circuit shown in FIG. 3A are possible. In the embodiment depicted, the five switches S1-S5 are implemented using four NMOS transistors and three PMOS transistors. NMOS transistor $M_{NE}$ has a source coupled to node 310, a drain coupled to node 308 and a gate that receives the signal R. Transistor $MN_E$ serves to couple node 308 of bank of bits 302 directly to node 310 of bank of bits 304 during retention mode and serves as switch S1. NMOS transistors $MN_A$ and $MN_B$ each have a drain coupled to node 308 and a source coupled together and to the drain of NMOS transistor $MN_C$. The source of transistor $MN_C$ is coupled to ground and the gate receives the signal $MN_2$; the gate of transistor $MN_B$ receives the signal $MN_1$; while the gate and drain of transistor $MN_A$ are coupled together so that $MN_A$ acts as a diode. Together, transistors $MN_B$ and $MN_C$ act as switch S2 to couple node 308 to the lower rail during functional mode. When transistor $MN_B$ is turned OFF but $MN_C$ is ON, then transistors $MN_A$ and $MN_C$ act as switch S3 to couple node 308 to a voltage that is a diode drop above the lower rail during transition mode.

PMOS transistor $MP_C$ has a source coupled to the upper rail, a drain coupled to the sources of PMOS transistors $MP_A$ and $MP_B$, and the gate receives the signal $MP_{1\#}$. In addition to being coupled in common to transistor $MP_C$, PMOS transistor $MP_A$ and $MP_B$ also have their drains commonly coupled to node 310. The gate of $MP_B$ receives signal $MP_{2\#}$, while the gate and drain of transistor $MP_A$ are coupled together to act as a diode. Thus, transistors $MP_B$ and $MP_C$ together implement switch S4 to couple node 310 to the upper rail during functional mode and transistors $MP_A$ and $MP_C$ together implement switch S5 to couple node 310 to a voltage that is a diode drop below the upper rail during transition mode.

Figure 4:
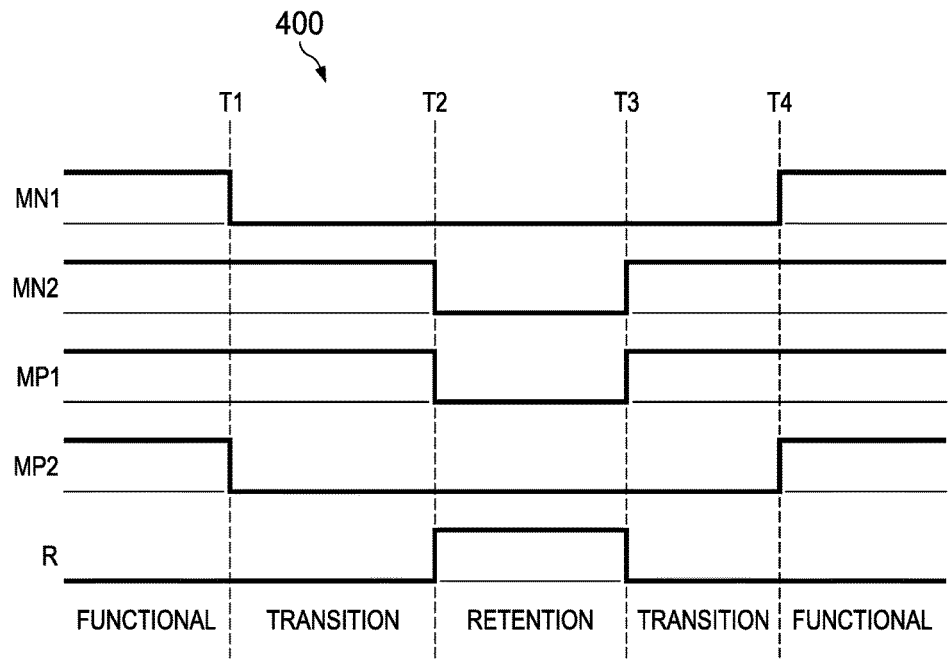
FIG. 4 depicts a set of signals coupled to control the switching circuit of FIG. 3 according to an embodiment of the disclosure.

Turning next to FIG. 4, the operation of signals $MN_1$, $MN_2$, $MP_1$, $MP_2$ and R are shown in graph 400, while $MP_{1\#}$ and $MP_{2\#}$ are the complements of $MP_1$ and $MP_2$. At the beginning of this graph, both banks of bits 302, 304 are in functional mode; signals $MN_1$, $MN_2$, $MP_1$, $MP_2$ are asserted high and signals R, $MP_{1\#}$, $MP_{2\#}$ are asserted low. This means that transistors $MN_B$ and $MN_C$ are ON, coupling node 308 directly to the lower rail and transistors $MP_B$ and $MP_C$ are ON, coupling node 310 directly to the upper rail. At time $T_1$, signals $MN_1$ and $MP_2$ are asserted low (and $MP_{2\#}$ is asserted high). This turns OFF transistors $MN_B$ and $MP_B$, which closes the direct coupling between node 308 and the lower rail and between node 310 and the upper rail, but allows these couplings to continue through the respective diode-coupled transistors $MN_A$, $MP_A$. It is notable that although this state is identical to the prior art retention mode coupling, in the disclosed embodiment, this state is only temporary, to provide a transition state between the functional mode and the new retention mode.

At time $T_2$, signals $MN_2$ and $MP_1$ are asserted low ($MP_{1\#}$ is asserted high) and signal R is asserted high. This turns OFF transistors $MN_C$ and $MP_C$ and turns ON transistor $MN_E$ to move the two arrays into retention mode, in which bank of bits 302 is directly coupled to bank of bits 304. In this mode, the leakage current from bank of bits 302 is collected together and used to provide current to bank of bits 304. Once this connection is established, the voltage drop between $V_{DD}$ and $V_{SS}$ is distributed between the two banks of bits 302, 304.

At time $T_3$, the two banks of bits 302, 304 need to be placed back into functional mode. First, signals $MN_2$ and $MP_1$ are asserted high and signals R, MP1# are asserted low. This combination turns OFF transistor $MN_E$ and turns ON transistors $MN_C$ and $MP_C$, so that node 308 is coupled to the lower rail through the diode created by transistor $MN_A$ and node 310 is coupled to the upper rail through the diode created by transistor $MP_A$ and the two banks of bits 302, 304 are placed in transition. Once the arrays have settled, at time $T_4$, signals $MN_1$ and $MP_2$ are asserted high and signal $MP_{2\#}$ is asserted low, turning ON transistors $MN_B$ and $MP_B$, directly coupling node 308 to the lower rail, directly coupling node 310 to the upper rail, and placing the two banks of bits 302 and 304 in functional mode.

Applicants have disclosed a memory array, which can be an SRAM array, in which the leakage current from a first bank of bitcells that are in retention mode is combined and used to provide current to a second bank of bitcells that are in retention mode. In addition to reducing current through the bitcells during retention mode by half, the disclosed embodiments reduce the retention mode power usage by approximately fifty percent, allowing either a savings in power or else doubling the amount of bits that can be maintained on a leakage budget. No power is lost to a diode as the leakage from a first bank is recycled to power a second bank of bitcells. The switching circuit that couples the two banks of bitcells together does not change states directly between the functional mode, in which the two banks of bitcells are individually powered, and the retention mode, in which the two banks of bitcells are coupled together. Instead, the switching circuit first moves through a transition mode in which the first bank of bits is coupled to the lower rail through a diode drop and the second bank of bits is coupled to the upper rail through a diode drop. In one embodiment, the first bank of bitcells is located physically above the second banks of bitcells. Stacking is transparent to the user Although various embodiments have been shown and described in detail, the claims are not limited to any particular embodiment or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described embodiments that are known to those of ordinary skill in the art are expressly incorporated herein by reference and are intended to be encompassed by the present claims. Accordingly, those skilled in the art will recognize that the exemplary embodiments described herein can be practiced with various modifications and alterations within the spirit and scope of the claims appended below.

What is claimed is:

1. A memory array comprising:
   a first plurality of memory elements, each memory element of the first plurality of memory elements being coupled to an upper rail and to a first node;
   a second plurality of memory elements, each memory element of the second plurality of memory elements being coupled to a second node and to a lower rail;
   a first switch coupled between the first node and the second node, the first switch comprising a first n-type metal oxide silicon (NMOS) transistor having a drain coupled to the first node, a source coupled to the second node, and a gate coupled to receive a first signal that indicates a retention mode;
   a second switch coupled between the first node and the lower rail, the second switch comprising a second NMOS transistor and a third NMOS transistor, the second NMOS transistor having a drain coupled to the first node, a source coupled to a drain of the third NMOS transistor, and a gate coupled to receive a second signal that indicates a functional mode, and the third NMOS transistor having a source coupled to the lower rail and a gate coupled to receive a third signal that is an inverse of the first signal;
   a third switch coupled between the second node and the upper rail;
   a fourth switch coupled between the first node and a voltage that is one diode drop above the lower rail; and
   a fifth switch coupled between the second node and a voltage that is one diode drop below the upper rail.

2. The memory array of claim 1, wherein the third switch comprises a first p-type metal oxide silicon (PMOS) transistor and a second PMOS transistor, the first PMOS transistor having a drain coupled to the second node, a source coupled to a drain of the second PMOS transistor and a gate coupled to receive a fourth signal that is an inverse of the second signal, the second PMOS transistor having a source coupled to the upper rail and a gate coupled to receive a fifth signal that is an inverse of the third signal.

3. The memory array of claim 2, wherein the fourth switch comprises the third NMOS transistor and a fourth NMOS transistor coupled as a diode, the fourth NMOS transistor having a drain coupled to the first node and a source coupled to the drain of the third NMOS transistor.

4. The memory array of claim 3, wherein the fifth switch comprises the second PMOS transistor and a third PMOS transistor coupled as a diode, the third PMOS transistor having a drain coupled to the second node and a source coupled to the drain of the second PMOS transistor.

5. The memory array of claim 4, wherein a bitcell in the first and second pluralities of memory elements comprises a six-transistor bitcell of static random access memory.

6. The memory array of claim 4, wherein each memory element of the first and second pluralities of memory elements is coupled to a first bitline pair.

7. The memory array of claim 4, wherein the first plurality of memory elements is stacked on top of the second plurality of memory elements.

8. An integrated circuit comprising:
   a first plurality of static random access memory (SRAM) bitcells, each bitcell of the first plurality of SRAM bitcells being coupled to an upper rail, to a first node, and to a first bitline pair;

a second plurality of SRAM bitcells, each bitcell of the second plurality of SRAM bitcells being coupled to a second node, to a lower rail, and to a second bitline pair; and a switching circuit coupled to the first node and to the second node, the switching circuit being arranged to couple the first node to the second node when the first and second pluralities of SRAM bitcells are in a retention mode;

the switching circuit comprising:

a first switch coupled between the first node and the second node, the first switch comprising a first n-type metal oxide silicon (NMOS) transistor having a drain coupled to the first node, a source coupled to the second node, and a gate coupled to receive a first signal that indicates the retention mode; and a second switch coupled between the first node and the lower rail, the second switch comprising a second NMOS transistor and a third NMOS transistor, the second NMOS transistor having a drain coupled to the first node, a source coupled to a drain of the third NMOS transistor, and a gate coupled to receive a second signal that indicates a functional mode, and the third NMOS transistor having a source coupled to the lower rail and a gate coupled to receive a third signal that is an inverse of the first signal.

9. The integrated circuit of claim 8, wherein the switching circuit is arranged to couple the first node to the lower rail and to couple the second node to the upper rail when the first and second pluralities of SRAM bitcells are in the functional mode.

10. The integrated circuit of claim 9, wherein the switching circuit is arranged to couple the first node to a first voltage that is one diode drop above the lower rail and to couple the second node to a second voltage that is one diode drop below the upper rail when the first and second pluralities of SRAM bitcells are in a transition mode.

11. The integrated circuit of claim 10, wherein the switching circuit is arranged to move between the functional mode and the retention mode through the transition mode.

12. The integrated circuit of claim 8, wherein the first plurality of SRAM bitcells and the second plurality of SRAM bitcells are six-transistor SRAM bitcells.

13. The integrated circuit of claim 8, wherein the first plurality of SRAM bitcells and the second plurality of SRAM bitcells are vertically stacked.

* * * * *